(12) United States Patent
Minamio et al.

(10) Patent No.: US 7,273,765 B2
(45) Date of Patent: Sep. 25, 2007

(54) SOLID-STATE IMAGING DEVICE AND METHOD FOR PRODUCING THE SAME

(75) Inventors: Masanori Minamio, Osaka (JP); Kouichi Yamauchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 591 days.

(21) Appl. No.: 10/676,186

(22) Filed: Sep. 30, 2003

(65) Prior Publication Data

US 2004/0212717 A1 Oct. 28, 2004

(30) Foreign Application Priority Data

Apr. 28, 2003 (JP) ............... 2003-123843

(51) Int. Cl.
*H01L 21/00* (2006.01)

(52) U.S. Cl. ............... 438/68; 438/64; 257/E21.599

(58) Field of Classification Search .......... 438/64, 438/66, 68, 125, 110, 113; 257/933, 439
See application file for complete search history.

(56) References Cited

U.S. PATENT DOCUMENTS

| | | | | |
|---|---|---|---|---|
| 5,064,782 | A | * | 11/1991 | Nishiguchi ............ 228/121 |
| 5,256,901 | A | * | 10/1993 | Ohashi et al. .......... 257/680 |
| 5,436,492 | A | | 7/1995 | Yamanaka |
| 5,729,437 | A | * | 3/1998 | Hashimoto ............ 361/760 |
| 5,811,799 | A | * | 9/1998 | Wu .................... 250/239 |
| 5,882,949 | A | * | 3/1999 | Okazaki ................ 438/26 |
| 5,905,301 | A | | 5/1999 | Ichikawa et al. |
| 5,950,074 | A | * | 9/1999 | Glenn et al. ........... 438/121 |
| 5,977,627 | A | * | 11/1999 | Smolley ................ 257/709 |

(Continued)

FOREIGN PATENT DOCUMENTS

EP 1 376 705 6/2003

(Continued)

OTHER PUBLICATIONS

Lu Brian et al., "Active Pixel Sensor (APS) Package", 1999 International Conference on High Density Packaging and MCMs, XP000980682, pp. 175-178.

*Primary Examiner*—David A. Zarneke
(74) *Attorney, Agent, or Firm*—Hamre, Schumann, Mueller & Larson, P.C.

(57) ABSTRACT

A solid-state imaging device includes: a planar substrate; an imaging element fixed onto the substrate; a rib provided on the substrate so as to surround the imaging element; a transparent plate fixed to a top face of the rib; a plurality of wirings for conducting electricity from inside of a package to outside of the same, the package being composed of the substrate, the rib and the transparent plate; and thin metal wires for connecting electrodes of the imaging element with the respective wirings. Each of the wirings includes: an internal electrode disposed on a surface with the imaging element mounted thereon; an external electrode disposed on a rear surface of the imaging-element mounted surface and at a position corresponding to the internal electrode and an end face electrode disposed on an end face of the substrate, for connecting the internal electrode and the external electrode. An end face of the substrate, a side face of the rib and an end face of the transparent plate form a substantially coplanar surface. The structure of the substrate having an external terminal is simple, thus facilitating the miniaturization of the device.

17 Claims, 3 Drawing Sheets

U.S. PATENT DOCUMENTS

| | | | |
|---|---|---|---|
| 5,998,862 A | 12/1999 | Yamanaka | |
| 6,057,597 A * | 5/2000 | Farnworth et al. | 257/710 |
| 6,060,340 A * | 5/2000 | Chou | 438/110 |
| 6,075,237 A * | 6/2000 | Ciccarelli | 250/208.1 |
| 6,130,448 A * | 10/2000 | Bauer et al. | 257/222 |
| 6,262,479 B1 * | 7/2001 | Chou | 257/704 |
| 6,268,231 B1 * | 7/2001 | Wetzel | 438/48 |
| 6,351,027 B1 * | 2/2002 | Giboney et al. | 257/684 |
| 6,383,835 B1 * | 5/2002 | Hata et al. | 438/65 |
| 6,590,269 B1 * | 7/2003 | Chuang et al. | 257/432 |
| 6,603,183 B1 * | 8/2003 | Hoffman | 257/434 |
| 6,660,557 B2 * | 12/2003 | Usami | 438/106 |
| 6,730,991 B1 | 5/2004 | Douglas | |
| 6,737,720 B2 * | 5/2004 | Ho et al. | 257/433 |
| 6,759,266 B1 * | 7/2004 | Hoffman | 438/64 |
| 6,767,753 B2 * | 7/2004 | Huang | 438/25 |
| 6,784,534 B1 * | 8/2004 | Glenn et al. | 257/704 |
| 6,803,251 B2 * | 10/2004 | Kwon et al. | 438/106 |
| 6,809,412 B1 | 10/2004 | Tourino et al. | |
| 6,890,834 B2 | 5/2005 | Komobuchi et al. | |
| 6,897,428 B2 | 5/2005 | Minamio et al. | |
| 6,900,531 B2 * | 5/2005 | Foong et al. | 257/687 |
| 6,929,974 B2 * | 8/2005 | Ding et al. | 438/106 |
| 6,982,470 B2 | 1/2006 | Omori | |
| 7,196,359 B2 * | 3/2007 | Baur et al. | 257/99 |
| 2001/0020738 A1 | 9/2001 | Iizima et al. | |
| 2002/0142510 A1 | 10/2002 | Adachi | |
| 2003/0193018 A1 * | 10/2003 | Tao et al. | 250/239 |
| 2004/0038442 A1 * | 2/2004 | Kinsman | 438/64 |

FOREIGN PATENT DOCUMENTS

| | | |
|---|---|---|
| JP | 5-267629 | 10/1993 |
| JP | 2000-058805 | 2/2000 |
| JP | 2001-102502 | 4/2001 |
| JP | 2001/257334 | 9/2001 |
| JP | 2002-043554 | 2/2002 |
| JP | 2002-203920 | 7/2002 |
| JP | 2002-299595 | 10/2002 |
| JP | 2002-353354 | 12/2002 |
| JP | 2002-353763 | 12/2002 |
| JP | 2002-373950 | 12/2002 |
| JP | 2004-200583 | 7/2004 |
| KR | 2001-0064908 | 7/2001 |

\* cited by examiner

SOLID-STATE IMAGING DEVICE AND METHOD FOR PRODUCING THE SAME

BACKGROUND OF THE INVENTION

1. Field of the Invention

The present invention relates to a solid-state imaging device configured by mounting an imaging element such as a CCD on a substrate and a method for producing the same.

2. Related Background Art

Solid-state imaging devices are used widely for video cameras and still cameras, and are provided in a form of a package in which an imaging element such as a CCD is mounted on a base made of an insulating material and a light-receptive region is covered with a transparent plate. In order to miniaturize the device, the imaging element is mounted on the base while maintaining a bare chip state. As a conventional example of such a solid-state imaging device, a solid-state imaging device described in JP 5(1993)-267629 A will be described below with reference to FIG. 7.

In FIG. 7, reference numeral 21 denotes a base. On a top face of the base, a recess is formed, and an imaging element chip 22 is fixed at a center of the recess. The base 21 is provided with a lead terminal 24, and a lead pad 25 of the lead terminal 24 and a bonding pad 23 on the imaging element chip 22 are connected via a bonding wire 26 made of a metal wire. On an outer peripheral portion of the top face of the base 21, a rib 28 is provided, and a light transmissive seal glass plate 27 is fixed thereon, so as to form a package for protecting the imaging element chip 22.

Such a solid-state imaging device is mounted on a circuit board, in such a position as shown in the drawing, with a seal glass plate 27 side facing upward, and the lead terminal 24 is used for the connection with an electrode on the circuit board. A lens barrel (not illustrated) with an imaging optical system incorporated therein is provided above the seal glass plate 27, where a relative positional relationship with a photo-receptive region formed in the imaging element chip 22 is set with predetermined accuracy. During the imaging operation, by means of the imaging optical system incorporated in the lens barrel, light from an object to be imaged is collected onto the light-receptive region so as to effect photoelectric conversion.

The above-described conventional solid-state imaging device has a configuration in which the lead terminal 24 is arranged at a side face of the base 21, and therefore the process of manufacturing the same becomes complicated and the miniaturization of the package becomes difficult.

In addition, due to the presence of the lead terminal 24, a side face of the package formed with an end face of the base 21, a side face of the rib 28 and an end face of the seal glass plate 27 is not flat. If the side face of the package is flat, at the time of mounting the lens barrel with the optical system included therein, the position of the lens barrel can be determined easily and with high precision by utilizing the side face of the package. That is to say, the position in the horizontal direction can be determined by bringing the side face of the package into contact with an internal face of the lens barrel, whereas the position in the vertical direction can be determined by bringing a bottom face of the lens barrel into contact with the circuit board face. On the other hand, if the side face of the package is not flat, it becomes difficult to determine the position with high precision by the above-described positioning method.

SUMMARY OF THE INVENTION

Therefore, with the foregoing in mind, it is an object of the present invention to provide a solid-state imaging device in which a substrate having an external terminal has a simple configuration, thus facilitating the miniaturization of the device. In addition, it is another object of the present invention to provide a solid-state imaging device in which a side face of a package is flat, which allows the positioning of a lens barrel with a stable accuracy by utilizing the side face of the package. Furthermore, it is still another object of the present invention to provide a manufacturing method that allows the easy mass production of such a solid-state imaging device.

A solid-state imaging device of the present invention includes: a substrate with a flat board form that is made of an insulating resin; an imaging element that is fixed onto the substrate; a rib with a rectangular frame form in a planar shape, which is provided on the substrate so as to surround the imaging element; a transparent plate that is fixed to a top face of the rib; a plurality of wirings for conducting electricity from inside of a package to the outside of the same, the package being comprised of the substrate, the rib and the transparent plate; and a thin metal wire provided in a space within the package, which connects electrodes of the imaging element with the respective wirings.

In order to cope with the above-stated problem, each of the plurality of wirings includes: an internal electrode disposed on a surface with the imaging element mounted thereon; an external electrode disposed on a rear surface of the imaging-element mounted face and at a position corresponding to the internal electrode; and an end face electrode disposed on an end face of the substrate, which connects the internal electrode and the external electrode, wherein an end face of the substrate, a side face of the rib and an end face of the transparent plate, which correspond to the side face of the package, form a substantially coplanar surface.

A method for producing a solid-state imaging device of the present invention is for producing a solid-state imaging device having the above-stated configuration. The method includes: forming a top-side conductive layer and a bottom-side conductive layer on a top face and a bottom face of a base material with a flat board form that is made of an insulation resin so that the top-side conductive layer and the bottom-side conductive layer correspond to a plurality of groups of the wirings for composing a plurality of the solid-state imaging devices, and forming a perforation conductive layer that penetrates through the base material so as to connect the top-side conductive layer and the bottom-side conductive layer; providing a rib formation member for forming the rib on the base material at a boundary between regions, each of which is for forming each of the plurality of solid-state imaging devices, so that the rib formation member extends transversely with respect to the top-side conductive layer above the perforation conductive layer; fixing the imaging element in each region surrounded by the rib formation member and connecting the electrode of the imaging element and the top-side conductive layer by means of the thin metal wire; fixing the transparent plate to a top end face of the rib formation member; and cutting the base material, the rib formation member and the transparent plate sequentially in a single operation in a direction perpendicular to the base material and in a direction that divides a width in a planar shape of the rib formation member into halves so as to separate the plurality of solid-state imaging devices into the respective pieces.

DETAILED DESCRIPTION OF THE INVENTION

Figure 1:
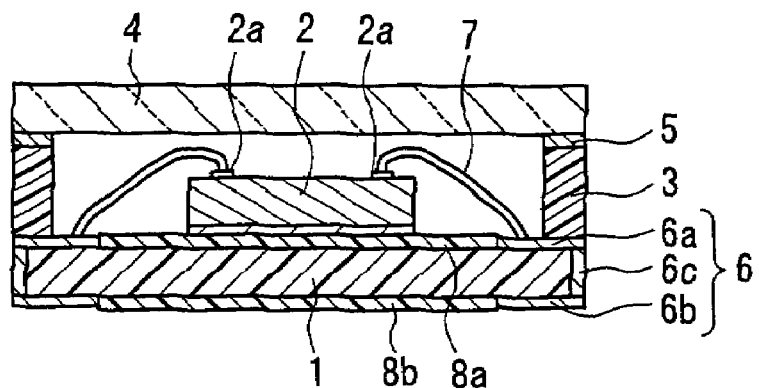
FIG. 1 is a cross-sectional view of a solid-state imaging device of Embodiment 1 of the present invention.

A solid-state imaging device of the present invention, as described above, has a configuration in which an imaging element is fixed onto a substrate within a package composed of the substrate, a rib and a transparent plate. The solid-state imaging device of the present invention is characterized in that each of a plurality of wirings for conducting electricity from inside of a package to outside of the same includes the following portions: an internal electrode formed on a surface with the imaging element mounted thereon; an external electrode formed on a rear face of the imaging-element mounted surface and at a position corresponding to the internal electrode; and an end face electrode formed on an end face of the substrate, which connects the internal electrode and the external electrode. An end face of the substrate, a side face of the rib and an end face of the transparent plate, which correspond to the side face of the package, form a substantially coplanar surface.

With this configuration, the substrate can be formed with a simple wiring board, and the wirings extending from the top face of the substrate to the bottom face by way of the end face can be formed easily by plating. Therefore, the configuration of the substrate is simple and the package can be miniaturized easily. In addition, since the side face of the package is flat, when mounting the lens barrel with the optical system included therein, the position of the lens barrel can be determined by bringing the side face of the package into contact with the internal face of the lens barrel, thus securing a high positioning accuracy.

In the above configuration, preferably, the end face of the substrate, the side face of the rib and the end face of the transparent plate are in a plane formed by cutting them sequentially in a single operation. Preferably, an internal side face of the rib has a tilt such that the internal side face spreads outwardly from a surface of the substrate toward the transparent plate. This configuration substantially suppresses the tendency of the reflection of the incident light from the internal side face of the rib to affect the imaging function adversely. In such a case, the internal side face of the rib may have a flat surface, and an angle of the tilt may be within a range of 2° to 12° with respect to a direction perpendicular to the face of the substrate. Alternatively, an orange peel skin pattern or a grained pattern may be formed on an internal side face of the rib. As another configuration, an internal side face of the rib may have a flat surface, and an external side face and the internal side face of the rib may be perpendicular to the face of the substrate.

In addition, the end face electrode may be disposed in a recess that is formed on the end face of the substrate, and a surface of the end face electrode may form a substantially coplanar face with the end face of the substrate, or may be recessed relative to the end face of the substrate. A surface of the external electrode may form a substantially coplanar surface with the rear surface of the substrate. Alternatively, the surface of the external electrode may be recessed relative to the rear surface of the substrate.

In the above configuration, an insulation film may be formed on the rear face of the substrate, and the insulation film and the external electrode may be arranged so as not to overlap each other. Alternatively, a peripheral portion of the external electrode and the insulation film may be arranged so as to overlap each other.

According to a method for producing a solid-state imaging device of the present invention, in order to form a plurality of groups of the wirings so as to correspond to a plurality of solid-state imaging devices each having the above-stated configuration, an upper-side conductive layer, a bottom-side conductive layer and a perforation conductive layer for connecting both of the conductive layers are formed with respect to a base material with a flat board form. Then, a rib formation member is provided so as to extend transversely with respect to the top-side conductive layer above the perforation conductive layer, an imaging element is mounted, and a transparent plate is fixed. Thereafter, the base material, the rib formation member and the transparent plate are cut sequentially in a single operation so as to separate the plurality of solid-state imaging devices into the respective pieces.

This manufacturing method is advantageous for the miniaturization, because the rib can be formed in the half width of the rib formation member. In addition, by cutting the base material, the rib formation member and the transparent plate sequentially in a single operation, a plane formed with an end face of the substrate, a side face of the rib and an end face of the transparent plate form a substantially coplanar surface, thus obtaining favorable flatness.

In the above method, preferably, the rib formation member is formed in a lattice form. In addition, preferably, the rib formation member is formed on the base material by resin forming. The resin forming may be carried out by molding using molds. These methods are useful for effectively producing a lot of imaging devices. Moreover, preferably, when forming the rib formation member by the resin molding, a sheet for suppressing generation of a flash of the resin is interposed between a mold for the resin molding and the base material.

The following specifically describes embodiments of the present invention, with reference to the drawings.

EMBODIMENT 1

Figure 2:
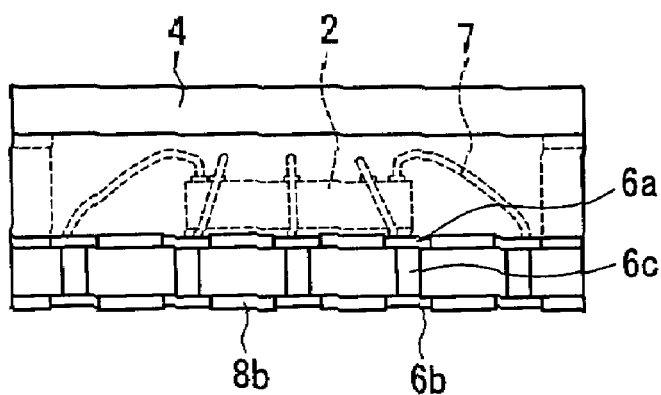
FIG. 2 is a side view of the solid-state imaging device of FIG. 1.
Figure 3:
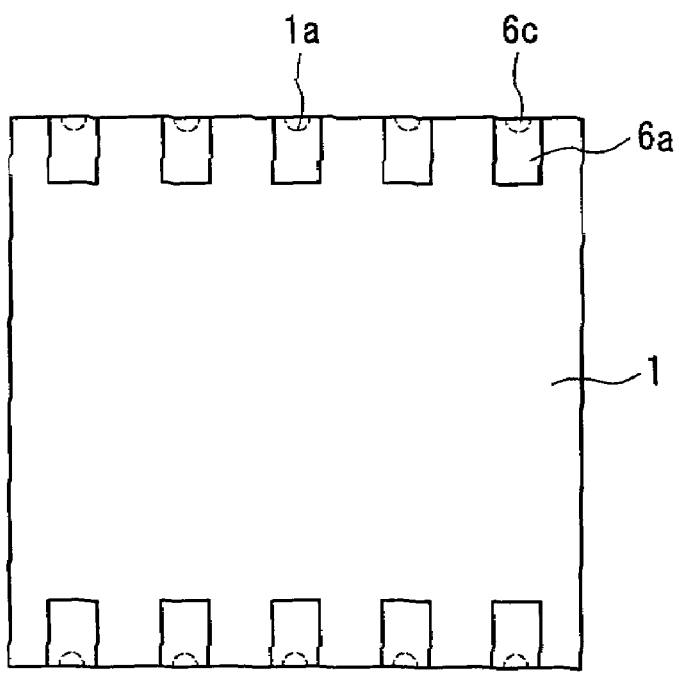
FIG. 3 is a bottom view of FIG. 2.

FIG. 1 is a cross-sectional view of a solid-state imaging device of Embodiment 1, and FIG. 2 is a side view of the same. FIG. 3 shows a bottom side of FIG. 2.

A substrate 1 has a flat board form and may be made of an insulating resin such as a glass epoxy resin that generally is used for wiring boards. An imaging element 2 is fixed onto the substrate 1, and a rib 3 with a rectangular frame form in a planar shape is provided on the substrate 1 so as to surround the imaging element 2. The rib 3 is made of, for example, an epoxy resin and is provided on the substrate 1 with a height of, for example, 0.3 to 1.0 mm by resin molding. On a top face of the rib 3, a transparent plate 4 is fixed with an adhesive 5. The substrate 1, the rib 3 and the transparent plate 4 form a package having a space therein, and a plurality of wirings 6 are formed for conducting electricity from the inside of the package to the outside. A thin metal wire 7 is provided in the space of the package for the connection of a pad electrode 2a of the imaging element 2 with each of the wirings 6. The overall thickness of the package is set at, for example, 2.0 mm or less.

The wirings 6 include an internal electrode 6a formed on the surface with the imaging element 2 mounted thereon, an external electrode 6b formed on the rear surface thereof and an end face electrode 6c formed on the end face of the substrate 1. The external electrode 6b is arranged at a position corresponding to the internal electrode 6b. The end face electrode 6c connects the internal electrode 6a and the external electrode 6b. The internal electrode 6a, the external electrode 6b and the end face electrode 6c all can be formed by, for example, plating. As shown in FIG. 3, the end face electrode 6c is disposed in a recess 1a formed on the end face of the substrate 1. A surface of the end face electrode 6c may form a substantially coplanar face with the end face of the substrate 1, or may be recessed relative to the end face of the substrate 1.

At a region around the internal electrode 6a and the external electrode 6b on the both faces of the substrate 1, insulation films 8a and 8b are formed (the insulation film 8b is not illustrated in FIG. 3). A surface of the external electrode 6b may be recessed relative to a surface of the insulation film 8b as shown in the drawings, or may form a substantially coplanar face with the surface of the insulation film 8b. The insulation film 8b and the external electrode 6b may be arranged so as not to have an overlapping portion with each other, or may be arranged so that a peripheral portion overlaps the insulation film 8b.

The end face of the substrate 1, the side face of the rib 3 and the end face of the transparent plate 4 that correspond to the respective side faces of the package are in a substantially coplanar face so as to form a flat side face of the package. This side face of the package can be formed to have a plane with a favorable flatness by, for example, cutting the end face of the substrate 1, the side face of the rib 3 and the end face of the transparent plate 4 sequentially in a single operation in the manufacturing process.

According to the above-described configuration, the substrate 1 is formed with a simple wiring board, and the wirings 6 extending from the top surface of the substrate 1 to the bottom surface by way of the side face can be formed easily by plating. Therefore, the package can be miniaturized easily. In addition, the external terminal is disposed on the rear face of the package, and moreover the electrode is present on the side face of the package also. Therefore, electrical connection with the circuit board using solder has a sufficient strength.

Furthermore, since the side face of the package is flat, when mounting the lens barrel with the optical system included therein, the position of the lens barrel can be determined by bringing the side face of the package into contact with the internal face of the lens barrel, thus securing a high positioning accuracy. In order to determine the position of the lens barrel with accuracy, a tilt of the side face of the package with respect to the face perpendicular to the face of the substrate 1 is controlled favorably within ±1°.

EMBODIMENT 2

Embodiment 2 relates to a method for producing a solid-state imaging device with the configuration described in Embodiment 1, which will be described below, with reference to FIGS. 1 to 3 and 4A to 4F.

Figure 4A:
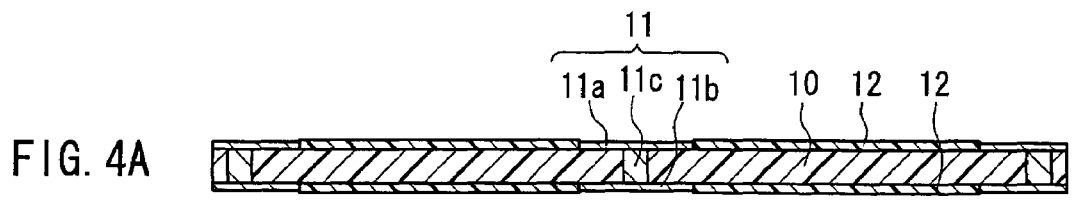
FIGS. 4A to F are cross-sectional views showing a method for producing a solid-state imaging device of Embodiment 2 of the present invention.

Firstly, as shown in FIG. 4A, a base material 10 with a flat board form made of an insulation resin is prepared. Over part of the base material 10, a wiring formation member 11 for forming the wirings 6 (see FIG. 1) is formed, and on the top and the bottom faces of the remaining region, insulation films 12 are formed. The wiring formation member 11 includes a top side conductive layer 11a and a bottom side conductive layer 11b that are formed on the top and the bottom surfaces of the base material 10, respectively. The top-side conductive layer 11a and the bottom-side conductive layer 11b are arranged at positions that are opposed to each other in the vertical direction, and are connected with each other via a perforation conductive layer 11c. These conductive layers may be formed by any methods that are used generally. For instance, a through hole may be formed in the substrate, the perforation conductive layer 11c may be formed by plating, and then the top-side conductive layer 11a and the bottom-side conductive layer 11b may be formed by plating so as to correspond to the position of the perforation conductive layer 11c.

The base material 10 has a size and a structure that allow a plurality of solid-state imaging devices to be formed at one time (FIG. 4 illustrates only a part of the base material 10). A plurality of groups of the wiring formation members 11 are formed so as to correspond to the plurality of solid-state imaging devices.

Figure 4B:
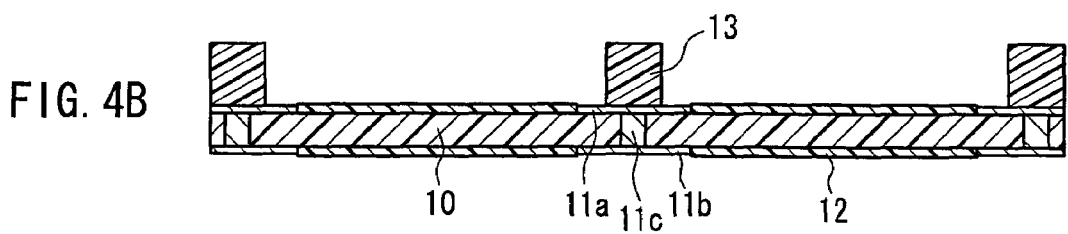

Next, as shown in FIG. 4B, a rib formation member 13 for forming the rib 3 (see FIG. 1) on the base material 10 is provided at a boundary between the regions for assembling the respective solid-state imaging devices. The rib formation member 13 is arranged so as to extend transversely with respect to the top-side conductive layer 11a at a position of the perforation conductive layer 11c. Consequently, the rib formation member 13 is provided commonly to the adjacent solid-state imaging devices, and, in the step described later, is separated so as to belong to the respective solid-state imaging devices.

Figure 5:
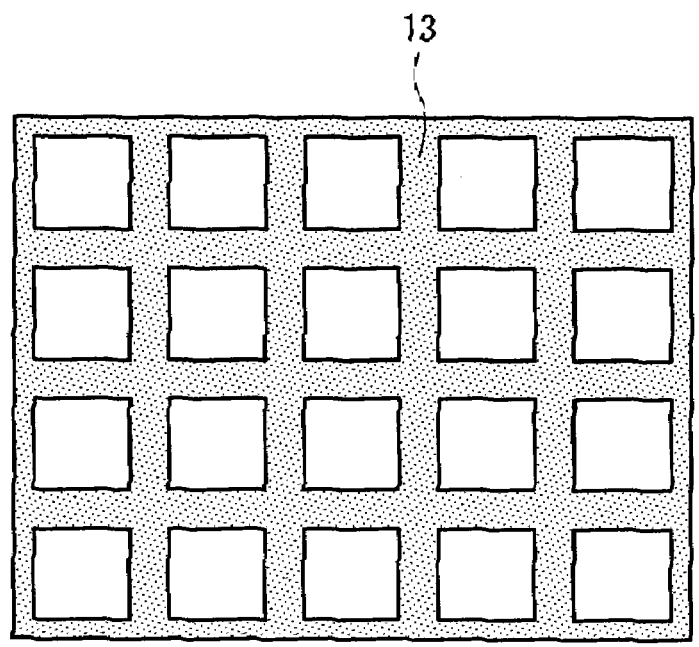
FIG. 5 is a plan view showing a rib formation member in the above method.

FIG. 5 shows one example of the rib formation member 13 in which a plurality of rectangular regions are formed in a lattice form. The rib formation member 13 may be formed by any suitable method. For instance, this can be formed directly on the surface of the base material 10 by resin molding using molds. When the rib formation member 13 is formed by resin molding, a polyimide sheet, for example, may be interposed between a mold for resin molding and the base material 10, whereby the generation of the resin flash can be reduced.

Figure 4C:
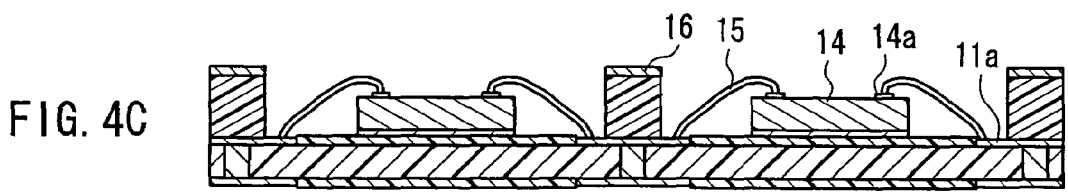
Figure 4D:
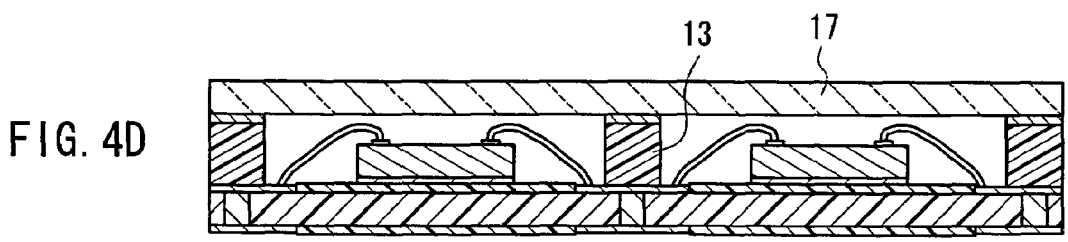

Next, as shown in FIG. 4C, imaging elements 14 are fixed in the respective regions surrounded by the rib formation member 13, and a pad electrode 14a on each of the imaging elements 14 and the corresponding top-side conductive layer 11a are connected with a thin metal wire 15. Then, an adhesive 16 is applied to the top face of the rib formation member 13. Next, as shown in FIG. 4D, a light-transmissive plate 17 is mounted on the top end face of the rib formation member 13, which is fixed with the adhesive 16.

Figure 4E:
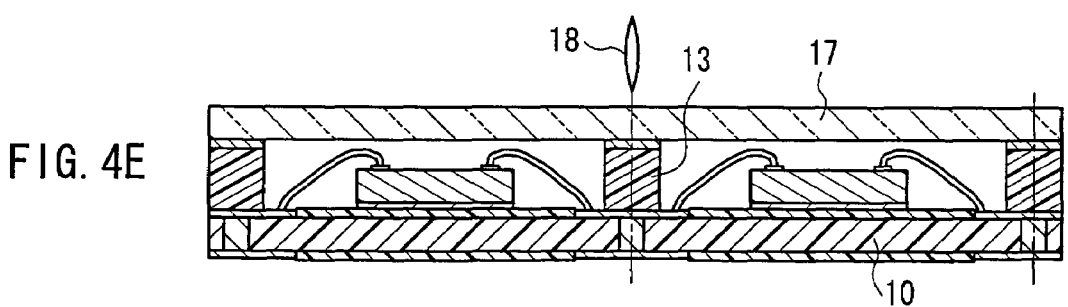
Figure 4F:
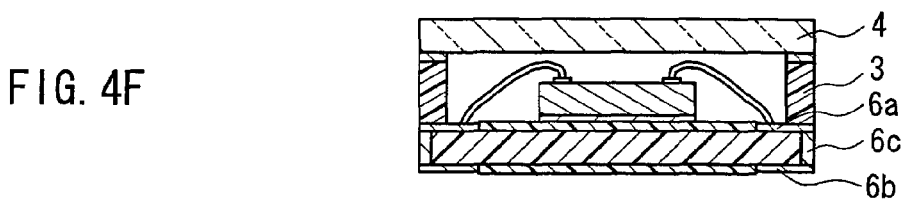

Next, as shown in FIG. 4E, the base material 10, the rib formation member 13 and the transparent plate 17 are cut with a dicing blade 18 so as to, as shown in FIG. 4F, divide it into the respective pieces each forming the solid-state imaging device. The cutting is conducted, as shown in FIG.

4E, in the direction perpendicular to the base material 10 and in the direction that divides the width in the planar shape of the rib formation member 13 into substantially equal halves. As a result, the rib formation member 13, the top-side conductive layer 11a, the bottom-side conductive layer 11b and the perforation conductive layer 11c are divided into substantially equal halves, each of which forms, as shown in FIG. 4F, a rib 3, an internal electrode 6a, an external electrode 6b and an end face electrode 6c in the respective pieces of the solid-state imaging devices.

This manufacturing method is advantageous for the miniaturization, because the rib 3 can be formed in the half width of the rib formation member 13. In addition, by cutting the base material 10, the rib formation member 13 and the transparent plate 17 sequentially in a single operation, a plane formed with an end face of the substrate 1, a side face of the rib 3 and an end face of the transparent plate 4 form substantially coplanar surface, thus obtaining favorable flatness.

EMBODIMENT 3

Figure 6:
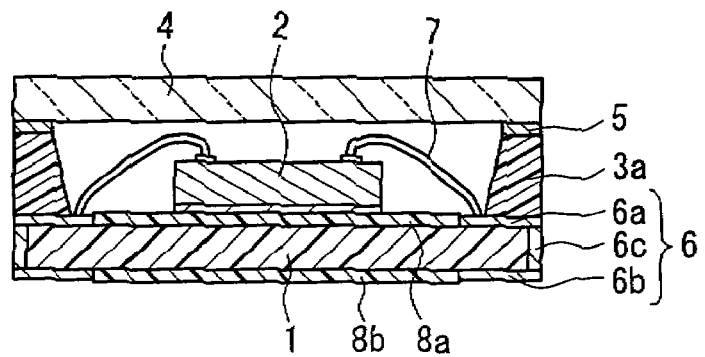
FIG. 6 is a cross-sectional view showing a solid-state imaging device of Embodiment 3 of the present invention.
Figure 7:
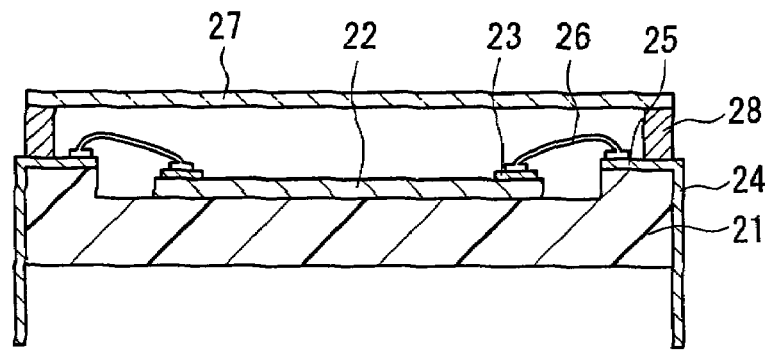
FIG. 7 is a cross-sectional view of a solid-state imaging device as a conventional example.

FIG. 6 is a cross-sectional view of a solid-state imaging device of Embodiment 3. The configuration of this solid-state imaging device is the same as that of Embodiment 1, with an exception of the shape of the internal side face of a rib 3a.

The feature of this embodiment resides in that the internal side face of the rib 3a is formed to have a tilt such that the internal side face spreads outwardly from the surface of the substrate 1 toward the transparent plate 4. This configuration prevents the reflection of the incident light from the internal side face of the rib 3a from adversely affecting the imaging function substantially. The internal side face of the rib 3a may be a flat surface, and an angle of the tilt may be within 2° to 12° with respect to the direction perpendicular to the surface of the substrate 1. In order to alleviate the influence of the reflection from the internal side face of the rib 3a, an orange peel skin pattern or a grained pattern may be formed on the internal side face of the rib 3a.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid-state imaging device, comprising:
   a substrate;
   an imaging element that is mounted on the substrate;
   a rib provided on the substrate so as to surround the imaging element;
   a transparent plate that is fixed to a top face of the rib;
   a wiring for connecting electrically the inside of a package with the outside of the package, the package being comprised of the substrate, the rib and the transparent plate; and
   a thin metal wire for connecting an electrode of the imaging element with the wiring,
   wherein the wiring includes: an internal electrode disposed on a surface of the substrate; an external electrode disposed on a rear surface of the substrate; and an end face electrode disposed under the rib so as to penetrate the substrate along a side face of the substrate, the end face electrode connecting the internal electrode and the external electrode, and
   at least a part of the end face electrode, the side face of the substrate, an outer side face of the rib and a side face of the transparent plate form a substantially coplanar surface.

2. The solid-state imaging device according to claim 1, wherein the side face of the substrate, the outer side face of the rib and the side face of the transparent plate are in a plane formed by cutting them in a single operation.

3. The solid-state imaging device according to claim 1, wherein an internal side face of the rib has a tilt such that the internal side face spreads outwardly from a face of the substrate toward the transparent plate.

4. The solid-state imaging device according to claim 3, wherein the internal side face of the rib has a flat surface, and an angle of the tilt is within a range of 2° to 12° with respect to a direction perpendicular to the face of the substrate.

5. The solid-state imaging device according to claim 1, wherein an orange peel skin pattern or a grained pattern is formed on an internal side face of the rib.

6. The solid-state imaging device according to claim 1, wherein an internal side face of the rib has a flat surface, and an external side face and the internal side face of the rib are perpendicular to the face of the substrate.

7. The solid-state imaging device according to claim 1,
   wherein an end face of the end face electrode is disposed in a recess that is formed on the end face of the substrate, and
   a surface of the end face electrode forms a substantially coplanar face with the end face of the substrate, or is recessed relative to the end face of the substrate.

8. The solid-state imaging device according to claim 1, wherein a surface of the external electrode forms a substantially coplanar surface with the rear surface of the substrate.

9. The solid-state imaging device according to claim 1, wherein a surface of the external electrode is recessed relative to the rear surface of the substrate.

10. The solid-state imaging device according to claim 9,
    wherein an insulation film is formed on the rear face of the substrate, and
    the insulation film and the external electrode are arranged so as not to overlap each other.

11. The solid-state imaging device according to claim 9,
    wherein an insulation film is formed on the rear face of the substrate, and
    a peripheral portion of the external electrode and the insulation film are arranged so as to overlap each other.

12. A method for producing the solid-state imaging device, comprising the steps of:
    forming a top-side conductive layer and a bottom-side conductive layer on a top face and a bottom face of a base material, and forming a perforation conductive layer that penetrates through the base material so as to connect the top-side conductive layer and the bottom-side conductive layer;
    providing a rib formation member for forming the rib on the base material at a boundary between regions, each of which is for fixing a solid-state imaging element, so that the rib formation member is positioned above the perforation conductive layer;
    fixing the imaging element in each region surrounded by the rib formation member and connecting the electrode of the imaging element and the top-side conductive layer by means of the thin metal wire;
    fixing the transparent plate to a top end face of the rib formation member; and cutting the perforation conductive layer, the base material, the rib formation member and the transparent plate in a single operation in a direction perpendicular to the surface of the base material and in a direction that divides a width in a planar shape of the rib formation member into halves so as to separate into respective pieces of the solid-state imaging devices.

13. The method for producing the solid-state imaging device according to claim 12, wherein the rib formation member is formed in a lattice form.

14. The method for producing the solid-state imaging device according to claim 12, wherein the rib formation member is formed on the base material by resin forming.

15. The method for producing the solid-state imaging device according to claim 14, wherein the resin forming is carried out by molding using molds.

16. The method for producing the solid-state imaging device according to claim 15, wherein, when forming the rib formation member by the resin molding, a sheet for suppressing generation of the resin flash is interposed between a mold for the resin molding and the base material.

17. The solid-state imaging device according to claim 1, wherein the external electrode is disposed on a rear surface of the substrate at a position corresponding to the internal electrode.

* * * * *